United States Patent
Yang et al.

(10) Patent No.: US 7,800,228 B2
(45) Date of Patent: Sep. 21, 2010

(54) RELIABLE VIA CONTACT INTERCONNECT STRUCTURE

(75) Inventors: Chih-Chao Yang, Poughkeepsie, NY (US); Oscar Van Der Straten, Mohegan Lake, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/435,410

(22) Filed: May 17, 2006

(65) Prior Publication Data

US 2007/0267751 A1    Nov. 22, 2007

(51) Int. Cl.
    *H01L 23/52* (2006.01)
(52) U.S. Cl. ............... 257/758; 257/774; 257/E23.145; 257/E23.151; 257/E21.577; 257/E21.579
(58) Field of Classification Search ................. 257/753, 257/760, E23.141, E23.145, 758, 774, E21.577, 257/E21.579, E23.151; 438/628, 639
See application file for complete search history.

(56) References Cited

U.S. PATENT DOCUMENTS

| | | | |
|---|---|---|---|
| 4,184,909 A | 1/1980 | Chang et al. | |
| 5,098,860 A | 3/1992 | Chakravorty et al. | |
| 5,930,669 A | 7/1999 | Uzoh et al. | |
| 5,933,753 A | 8/1999 | Simon et al. | |
| 5,985,762 A | 11/1999 | Geffken et al. | |
| 6,077,770 A * | 6/2000 | Hsu | 438/622 |
| 6,383,920 B1 | 5/2002 | Wang et al. | |
| 6,429,519 B1 | 8/2002 | Uzoh | |
| 6,784,105 B1 | 8/2004 | Yang et al. | |
| 6,893,959 B2 | 5/2005 | Barth | |
| 7,317,253 B2 * | 1/2008 | Nogami | 257/758 |
| 2004/0063310 A1 * | 4/2004 | Ngo et al. | 438/637 |
| 2005/0082089 A1 * | 4/2005 | Grunow et al. | 174/266 |
| 2006/0178002 A1 * | 8/2006 | Kim et al. | 438/622 |
| 2007/0052101 A1 * | 3/2007 | Usami | 257/758 |

OTHER PUBLICATIONS

Liang, Mong-Song, "Challenges in Cu/Low-K Integration." *IEEE* (2004).
Edelstein, D., "Comprehensive Reliability Evaluation of a 90 nm CMOS Technology with Cu/PECVD Low-K BEOL." IBM Semiconductor Research and Development Center (2004).

* cited by examiner

*Primary Examiner*—Steven Loke
*Assistant Examiner*—Suberr Chi
(74) *Attorney, Agent, or Firm*—Scully, Scott, Murphy & Presser, P.C.; Louis J. Percello, Esq.

(57) ABSTRACT

A reliable and mechanical strong interconnect structure is provided that does not include gouging features in the bottom of the an opening, particularly at a via bottom. Instead, the interconnect structures of the present invention utilize a Co-containing buffer layer that is selectively deposited on exposed surfaces of the conductive features that are located in a lower interconnect level. The selective deposition is performed through at least one opening that is present in a dielectric material of an upper interconnect level. The selective deposition is performed by electroplating or electroless plating. The Co-containing buffer layer comprises Co and at least one of P and B. W may optionally be also present in the Co-containing buffer layer.

12 Claims, 4 Drawing Sheets

RELIABLE VIA CONTACT INTERCONNECT STRUCTURE

FIELD OF THE INVENTION

The present invention relates to a semiconductor structure and a method of fabricating the same. More particularly, the present invention relates to an interconnect structure having increased reliability and strength of the via to wire connection with no significant impact to resistance or processing complexity.

BACKGROUND OF THE INVENTION

Generally, semiconductor devices include a plurality of circuits which form an integrated circuit fabricated on a semiconductor substrate. A complex network of signal paths will normally be routed to connect the circuit elements distributed on the surface of the substrate. Efficient routing of these signals across the device requires formation of multilevel or multilayered schemes, such as, for example, single or dual damascene wiring structures. Within a typical interconnect structure, metal vias run perpendicular to the semiconductor substrate and metal lines run parallel to the semiconductor substrate.

As millions and millions of devices and circuits are squeezed on a semiconductor chip, the wiring density and the number of metal levels are both increased generation after generation. In order to provide low RC for high signal speed, low k dielectric materials having a dielectric constant of less than silicon dioxide as well as copper-containing lines are becoming a necessity. The quality of thin metal wirings and studs formed by a conventional damascene process is extremely important to ensure yield and reliability. The major problem encountered in this area today is poor mechanical integrity of deep submicron metal studs embedded in low k dielectric materials, which can cause unsatisfied thermal cycling and stress migration resistance in interconnect structures. This problem becomes more severe when either new metallization approaches or porous low k dielectric materials are used.

To solve this weak mechanical strength issue while employing copper damascene and low k dielectric materials in an interconnect structure, a so called "via punch-through" technique has been adopted by the semiconductor industry. The via punch-through provides a via-gouging feature (or anchoring area) within the interconnect structure. Such a via-gouging feature is reported to achieve a reasonable contact resistance as well as an increased mechanical strength of the contact stud. These findings have been reported, for example, in M. -Si. Liang "Challenges in Cu/Low k Integration", IEEE Int. Electron Devices Meeting, 313 (2004), D. Edelstein et al. "Comprehensive Reliability Evaluation of a 90 nm CMOS Technology with Cu/PECVD Low k BEOL", IEEE Int. Reliability Physics Symp., 316 (2004), and U.S. Pat. Nos. 4,184,909 to Chang et al., 5,933,753 to Simon et al., 5,985,762 to Geffken et al., 6,429,519 to Uzoh et al. and 6,784,105 to Yang et al.

However, the argon sputtering technique that is used to create via gouging in the prior art damages the low k dielectric material. Because of the requirement of creating the gouging feature, the final interconnect structure includes severe damage that has been introduced into the low k dielectric material from the Ar sputtering process. This becomes a major yield detractor and a reliability concern for advanced chip manufacturing.

Figure 1:
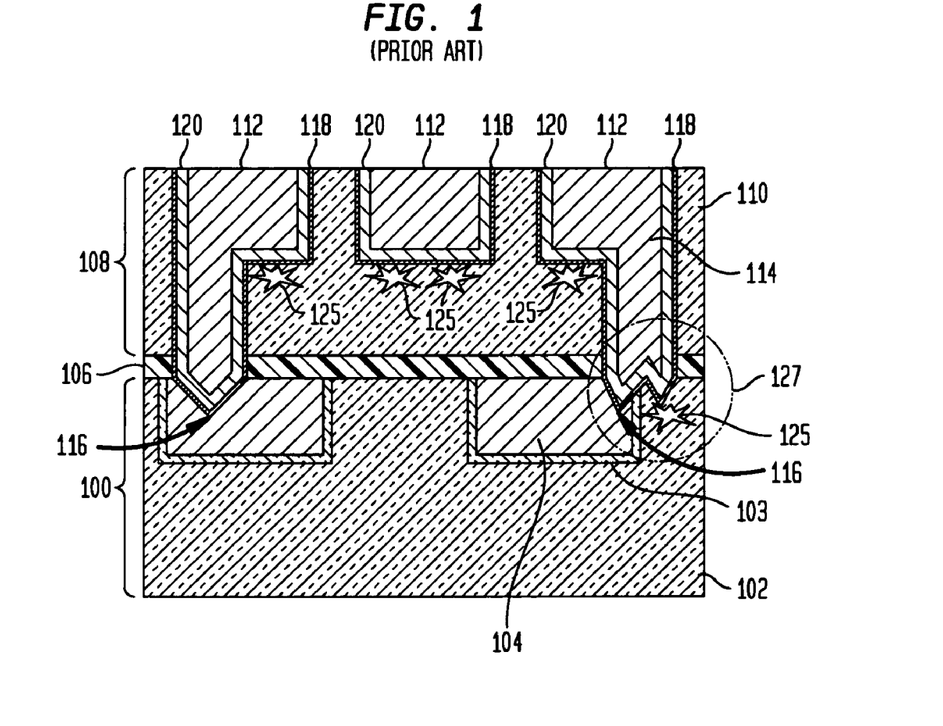
FIG. 1 is a pictorial representation (through a cross sectional view) depicting a prior art interconnect structure which includes via gouging features and damaged regions introduced into the dielectric materials of the interconnect structure during formation of said via gouging feature.

The problem of prior art interconnect structures including via gouging features created by argon sputtering is shown in FIG. 1. Specifically, FIG. 1 shows a prior art interconnect structure including an upper interconnect level 108 located atop a lower interconnect level 100. The lower interconnect level 100 includes a first low k dielectric material 102 which includes at least one conductive feature 104. The at least one conductive feature 104 is typically spaced apart from the first low k dielectric material 102 by a diffusion barrier 103. The conductive feature 104 is typically a metallic line that is embedded with the first low k dielectric material. The lower interconnect level 100 is typically separated in part from the upper interconnect level 108 by a capping layer 106. The upper interconnect level 108 includes a second low k dielectric material 110 that includes conductively filled lines 112 and conductively vias 114 located therein. In some embodiments, as shown in FIG. 1, a conductively filled line 112 is positioned directly above and in contact with a conductively filled via 114. The combination of the conductively filled line 112 and the conductively filled via 114 has a via gouging feature 116 that extends into the at least one conductive feature 104 of the lower interconnect level 100. As is illustrated, the conductively filled lines 112 and the conductively filled vias 114 each include a conductive material. A first diffusion barrier 118 and a second diffusion barrier 120 separate the conductive regions from the dielectric material. Regions 125 shown in FIG. 1 denote the damaged regions that are formed into the dielectric materials during Ar sputtering which is used in creating the via gouging feature 116. The damaged regions 125 result in an undesirable roughness at the bottom of the conductive feature. As is shown on the far right hand side of the drawing, the prior art process also damages the first dielectric layer 102 at a misaligned via pattern 127. A misaligned via pattern is defined when a via is not fully aligned/landed onto the underlying interconnect level.

Both of these characteristics degrade the overall wiring reliability as well as the strength of the via to wire connection. Moreover, both of the aforementioned characteristics result in the structure exhibiting a high-level of metal-to-metal leakage.

Porous ultra-low k dielectric materials (having a dielectric constant of about 2.8 or less) have been developed and have been used in interconnect structures as one of the interlevel dielectrics. As compared to dense (i.e., non-porous) low k dielectrics, the damage impact of argon sputtering is much higher on most ultra-low k dielectric materials tested, which makes integration of the current metallization approach with ultra-low k dielectric materials nearly impossible. As a result, all of the current ultra-low k hardware has failed during barrier integrity testing.

In view of the above drawbacks with prior art interconnect structures, and particularly in those including a porous ultra-low k dielectric as one of the interlevel dielectric materials, there is a continued need for developing a new and improved integration scheme that improves the reliability and strength of the via to wire connection, without introducing any damaged regions into the dielectric material.

SUMMARY OF THE INVENTION

The present invention provides an interconnect structure and method of fabricating the same which increases the reliability and strength of the via to wire connection, without introducing any damaged regions into the dielectric materials of the interconnect structure. This is achieved with no significant impact to resistance or processing complexity. Additionally, the inventive interconnect structure and method are especially helpful for misaligned via patterns.

In accordance with the present invention, the above can be achieved without introducing via gouging features into the interconnect structure thereby avoiding the use of Ar sputtering. In particular, the above is achieved in the present invention by providing a Co-containing buffer layer in the bottom of an opening (typically a via) that is in direct contact with the conductive feature of an underlying interconnect level. In accordance with the present invention, the Co-containing buffer layer lies directly atop of an exposed surface of the conductive feature of an underlying interconnect level. The Co-containing buffer layer is formed selectively in, and is restricted to, the interface between the opening of an upper interconnect level and the underlying conductive feature of a lower interconnect level.

In general terms, the present invention provides a semiconductor structure, e.g., an interconnect structure, that comprises:

a lower interconnect level comprising a first dielectric material having at least one conductive feature embedded therein;

an upper interconnect level comprising a second dielectric material having at least one opening that is in direct contact with said at least one conductive feature of the lower interconnect level;

a Co-containing buffer layer disposed in said at least one opening only on exposed surfaces of said at least one conductive feature of the lower interconnect level;

first and second liners located within said at least one opening; and a conductive material located on said second liner in said at least one opening.

In some embodiments of the present invention, the first and second liners are present continuously within the at least one opening. In such an embodiment, the structure of the present invention comprises:

a lower interconnect level comprising a first dielectric material having at least one conductive feature embedded therein;

an upper interconnect level comprising a second dielectric material having at least one opening that is in direct contact with said at least one conductive feature of the lower interconnect level;

a Co-containing buffer layer disposed in said at least one opening only on exposed surfaces of said at least one conductive feature of the lower interconnect level;

first and second liners located continuously within said at least one opening; and a conductive material located on said second liner in said at least one opening.

In yet another embodiment of the present invention, the first liner is not continuous and it is absent from atop the Co-containing buffer layer. In this particular embodiment of the present invention, the structure of the present invention comprises:

a lower interconnect level comprising a first dielectric material having at least one conductive feature embedded therein; an upper interconnect level comprising a second dielectric material having at least one opening that is in direct contact with said at least one conductive feature of the lower interconnect level;

a Co-containing buffer layer disposed in said at least one opening only on exposed surfaces of said at least one conductive feature of the lower interconnect level;

first and second liners located within said at least one opening, wherein said first liner is non-continuous and is absent from atop the Co-containing buffer layer; and a conductive material located on said second liner in said at least one opening.

In any of the embodiments mentioned above, it is preferred that the conductive material present in the at least one opening is Cu or a Cu-containing alloy.

In addition to the above, the present invention also relates to a method of fabricating such structures. In general terms, the method of the present application comprises:

providing a multilevel interconnect structure comprising a lower interconnect level and an upper interconnect level, wherein said lower interconnect level comprises a first dielectric material having at least one conductive feature embedded therein and said upper interconnect level comprises a second dielectric material having at least one opening that is in direct contact with said at least one conductive feature of the lower interconnect level;

selectively depositing a Co-containing buffer layer in said at least one opening only on exposed surfaces of said at least one conductive feature of the lower interconnect level;

forming first and second liners within said at least one opening; and forming a conductive material on said second liner in said at least one opening.

BRIEF DESCRIPTION OF THE DRAWINGS

FIG. 1 also shows a misaligned via pattern.

DETAILED DESCRIPTION OF THE INVENTION

The present invention, which provides an interconnect structure including a Co-containing alloy located at the interface between the opening of an upper interconnect level and a conductive feature of a lower interconnect level and a method of fabricating the same, will now be described in greater detail by referring to the following discussion and drawings that accompany the present application. The drawings of the present application, which are referred to herein below in greater detail, are provided for illustrative purposes and, as such, they are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 2A:
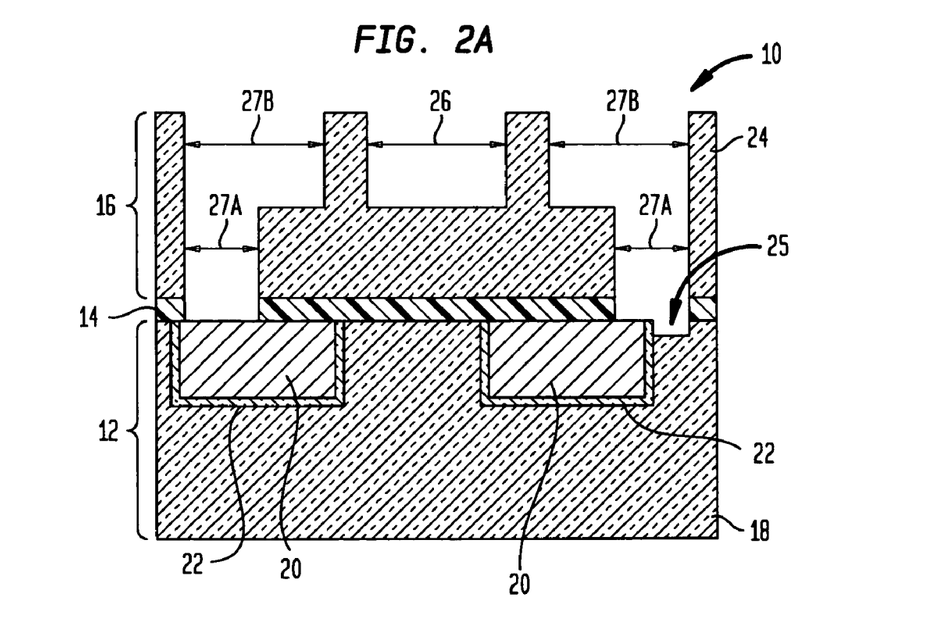
FIGS. 2A-2F are pictorial representations (through cross sectional views) depicting the basic processing steps employed in a first embodiment of the present invention.

The process flow of the present invention begins with providing the initial interconnect structure 10 shown in FIG. 2A. Specifically, the initial interconnect structure 10 shown in FIG. 2A comprises a multilevel interconnect including a lower interconnect level 12 and an upper interconnect level 16 that are typically, but not necessarily always, separated in part by dielectric capping layer 14. The lower interconnect level 12, which may be located above a semiconductor substrate including one or more semiconductor devices, comprises a first dielectric material 18 having at least one conductive feature (i.e., conductive region) 20 that is separated from the first dielectric material 18 by a barrier layer 22. The upper interconnect level 16 comprises a second dielectric material 24 that has at least one opening located therein. FIG. 2A also shows a misaligned via pattern 25. In FIG. 2A, two openings are shown; reference number 26 denotes a line opening for a single damascene structure, and reference numerals 27A and 27B denote a via opening and a line opening, respectively for a dual damascene structure. Although such a structure is shown, the present application is not limited to such a structure. Instead, the present application contemplates structures that include at least one opening to the underlying conductive feature 20. Typically, that at least one opening is a via opening located beneath a line opening.

The initial interconnect structure 10 shown in FIG. 2A is made utilizing standard interconnect processing which is well known in the art. For example, the initial interconnect structure 10 can be formed by first applying the first dielectric material 18 to a surface of a substrate (not shown). The substrate, which is not shown, may comprise a semiconducting material, an insulating material, a conductive material or any combination thereof. When the substrate is comprised of a semiconducting material, any semiconductor such as Si, SiGe, SiGeC, SiC, Ge alloys, GaAs, InAs, InP and other III/V or II/VI compound semiconductors may be used. In addition to these listed types of semiconducting materials, the present invention also contemplates cases in which the semiconductor substrate is a layered semiconductor such as, for example, Si/SiGe, Si/SiC, silicon-on-insulators (SOIs) or silicon germanium-on-insulators (SGOIs).

When the substrate is an insulating material, the insulating material can be an organic insulator, an inorganic insulator or a combination thereof including multilayers. When the substrate is a conducting material, the substrate may include, for example, polySi, an elemental metal, alloys of elemental metals, a metal silicide, a metal nitride or combinations thereof including multilayers. When the substrate comprises a semiconducting material, one or more semiconductor devices such as, for example, complementary metal oxide semiconductor (CMOS) devices can be fabricated thereon.

The first dielectric material 18 of the lower interconnect level 12 may comprise any interlevel or intralevel dielectric including inorganic dielectrics or organic dielectrics. The first dielectric material 18 may be porous or non-porous. Some examples of suitable dielectrics that can be used as the first dielectric material 18 include, but are not limited to: $SiO_2$, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The first dielectric material 18 typically has a dielectric constant that is about 4.0 or less, with a dielectric constant of about 2.8 or less being even more typical. These dielectrics generally have a lower parasitic crosstalk as compared with dielectric materials that have a higher dielectric constant than 4.0. The thickness of the first dielectric material 18 may vary depending upon the dielectric material used as well as the exact number of dielectrics within the lower interconnect level 12. Typically, and for normal interconnect structures, the first dielectric material 18 has a thickness from about 200 to about 450 nm.

The lower interconnect level 12 also has at least one conductive feature 20 that is embedded in (i.e., located within) the first dielectric material 18. The conductive feature 20 comprises a conductive region that is separated from the first dielectric material 18 by a barrier layer 22. The conductive feature 20 is formed by lithography (i.e., applying a photoresist to the surface of the first dielectric material 18, exposing the photoresist to a desired pattern of radiation, and developing the exposed resist utilizing a conventional resist developer), etching (dry etching or wet etching) an opening in the first dielectric material 18 and filling the etched region with the barrier layer 22 and then with a conductive material forming the conductive region. The barrier layer 22, which may comprise Ta, TaN, Ti, TiN, Ru, RuN, W, WN or any other material that can serve as a barrier to prevent conductive material from diffusing there through, is formed by a deposition process such as, for example, atomic layer deposition (ALD), chemical vapor deposition (CVD), plasma enhanced chemical vapor deposition (PECVD), physical vapor deposition (PVD), sputtering, chemical solution deposition, or plating.

The thickness of the barrier layer 22 may vary depending on the exact means of the deposition process as well as the material employed. Typically, the barrier layer 22 has a thickness from about 4 to about 40 nm, with a thickness from about 7 to about 20 nm being more typical.

Following the barrier layer 22 formation, the remaining region of the opening within the first dielectric material 18 is filled with a conductive material forming the conductive feature 20. The conductive material used in forming the conductive feature 20 includes, for example, polySi, a conductive metal, an alloy comprising at least one conductive metal, a conductive metal silicide or combinations thereof. Preferably, the conductive material that is used in forming the conductive feature 20 is a conductive metal such as Cu, W or Al, with Cu or a Cu alloy (such as AlCu) being highly preferred in the present invention. The conductive material is filled into the remaining opening in the first dielectric material 18 utilizing a conventional deposition process including, but not limited to: CVD, PECVD, sputtering, chemical solution deposition or plating. After deposition, a conventional planarization process such as, for example, chemical mechanical polishing (CMP) can be used to provide a structure in which the barrier layer 22 and the conductive feature 20 each have an upper surface that is substantially coplanar with the upper surface of the first dielectric material 18.

After forming the at least one conductive feature 20, the dielectric capping layer 14 is formed on the surface of the lower interconnect level 12 utilizing a conventional deposition process such as, for example, CVD, PECVD, chemical solution deposition, or evaporation. It is noted that the dielectric capping layer is not necessarily required in all circumstances. The dielectric capping layer 14 comprises any suitable dielectric capping material such as, for example, SiC, $Si_4NH_3$, $SiO_2$, a carbon doped oxide, a nitrogen and hydrogen doped silicon carbide SiC(N,H) or multilayers thereof. The thickness of the capping layer 14 may vary depending on the technique used to form the same as well as the material make-up of the layer. Typically, the capping layer 14 has a thickness from about 15 to about 55 nm, with a thickness from about 25 to about 45 nm being more typical.

Next, the upper interconnect level 16 is formed by applying the second dielectric material 24 to the upper exposed surface of the capping layer 14. The second dielectric material 24 may comprise the same or different, preferably the same, dielectric material as that of the first dielectric material 18 of the lower interconnect level 12. The processing techniques and thickness ranges for the first dielectric material 18 are also applicable here for the second dielectric material 24. Next, at least one opening is formed into the second dielectric material 24 utilizing lithography, as described above, and etching. The etching may comprise a dry etching process, a wet chemical etching process or a combination thereof. The term "dry etching" is used herein to denote an etching technique such as reactive-ion etching, ion beam etching, plasma etching or laser ablation. In accordance with the present invention, the above described etching step also removes a portion of the dielectric capping layer 14 that is located atop the conductive feature 20 in order to expose a part of the conductive feature 20 in the lower interconnect level 12.

It should be noted that during the above described etching step a misaligned via region 25 is sometimes formed. As shown, a portion of the misaligned via region 25 lands on the conductive feature 20, while other portions of the misaligned via region 25 are formed into the adjacent first dielectric material 18.

Figure 2B:
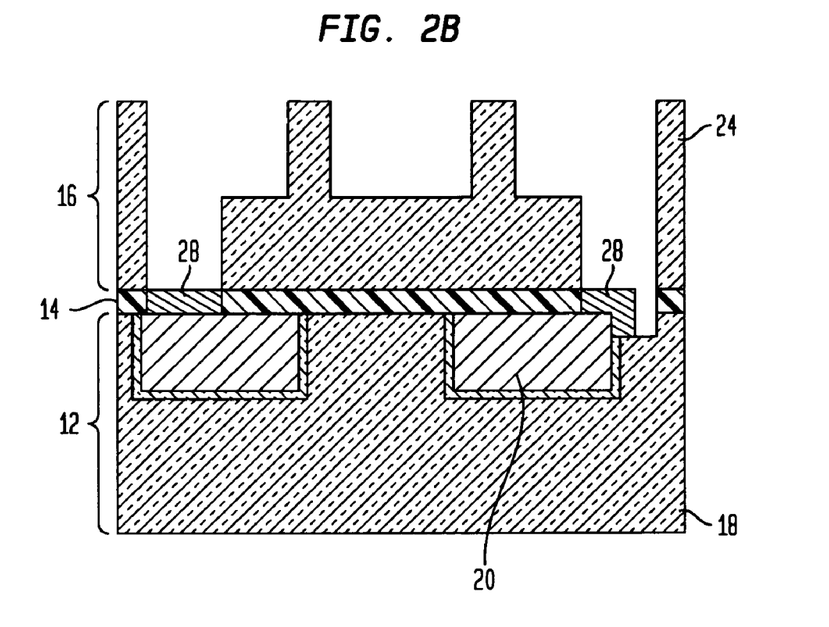

FIG. 2B shows the structure that is formed after disposing a Co-containing buffer layer 28 on at least the exposed parts of the conductive feature 20 in the lower interconnect level. It is noted that in the misaligned via region 25 the Co-containing buffer layer 28 forms on the exposed horizontal and vertical surfaces of the conductive feature 20. It should be pointed out that in this drawing and the remaining drawings some of the elements shown therein are not labeled for clarity. The unlabeled elements are the same as those labeled and shown in FIG. 2A.

In accordance with the present invention, the Co-containing buffer layer 28 is formed by a selective deposition process including, for example, electroplating and electroless plating.

The Co-containing buffer layer 28 comprises elemental Co alone, or elemental Co and at least one of P and B. Optionally, W may also be used. Thus, the present invention provides a Co-containing buffer layer 28 that includes one of Co, CoP, CoWP, CoB, and CoWB. Of these materials, CoP or CoWP are preferred materials for the Co-containing buffer layer 28.

The thickness of the Co-containing buffer layer 28 may vary depending on the exact conditions of the selective deposition process employed. In general, the thickness of the Co-containing buffer layer 28 is from about 1 to about 20 nm, with a thickness from about 4 to about 10 nm being even more typical. It is noted that the selective deposition of the Co-containing buffer layer 28 provides a layer whose thickness is essentially uniform across the entire deposition surface. That is, the selective deposition process provides a Co-containing buffer layer 28 having little or no thickness variation (on the order of about 20 Å or less) across the entire deposition surface, e.g., the exposed portion of conductive feature 20.

In accordance with the present invention, the Co-containing buffer layer 28 in the via bottom (or lower portion of the opening) provides improved mechanical/adhesion strength which, in turn, improves the reliability of the via to wire connection. The improved mechanical/adhesion strength and via to wire connection reliability is achieved in the present invention without the need of providing a via gouging feature in the bottom of the via. Since no via gouging feature is contemplated in the present application, the dielectrics of the inventive interconnect structure are not damaged by Ar plasma as is the case with prior art interconnect structure including a via gouging feature. The presence of the Co-containing buffer layer 28 also benefits the misalignment vias by sealing the underneath interconnect 20, and preventing diffusion of the interconnect material 20 into the dielectric 18.

As stated above, the Co-containing buffer layer 28 is formed by a selective deposition process including, for example, electroplating and electroless plating. Both of these selective deposition techniques are well known to those skilled in the art.

Electroplating comprises the precipitation of a metal at an electrode as the result of the passage of an electrical current through a solution or suspension of a metal-containing material. Electroplating has the ability to coat complexes shapes and irregular cavities with exact thickness control. The electroplating process employed in the present invention can be performed utilizing conditions that are well known in the electroplating art.

In an electroless deposition process, a redox reaction involving the oxidation of one or more soluble reducing agent(s) and the reduction of one or more metallic ions occurs on the surface of a substrate. For many metals including Cu, Ni, Co, Au, Ag Pd, Rh, the freshly deposited surface is sufficiently catalytic for the process to continue.

In electroless plating, activation of a surface, non conductive, or semiconductor can be achieved by the incorporation onto the top surface layer of nanometer sized catalytic particles. These catalytic particles can be either Pd, Co, Ni, and they can be applied by a either physical or chemical deposition.

The function of these particles is to catalyze and initiate the electrochemical deposition reaction when the substrate is immersed into an electroless plating bath. The electroless plating bath deposits a conductive layer on the catalyzed area of the substrate, the thickness of the plating layer depending mainly on the time of exposure to the plating bath. A suitable electroless plating system used in this invention is based on the use of the hypophosphite reducing agent. In this system, a mixture of hypophosphite ions and cobalt ions is made together with citrate stabilizing agent, at a suitable pH and temperature (usually between 65° to 75° C.). When the activated catalyzed substrate described above is immersed on this plating bath, the following reaction occurs on the substrate:

$$Co^{2+} + 2H_2PO_2^- \xrightarrow{(Pd)} Co\ metal + 2HPO_3^- + 2H^+$$

The Co metal is then deposited selectively on top of the catalyzed Pd layer on the substrate. The metal deposited by this reaction, can be either Co, CoP, CoWP, CoB or CoWB, depending on the composition of the plating bath solution. The catalytic layer can be either Pd, Co or Ni metal. The catalytic Pd layer can be incorporated on the surface of the substrate either by ion implantation, or other type of physical deposition method, or it can be applied by chemical means. For example, a colloidal Pd catalytic solution containing microparticles of Pd in suspension can be injected in the inside of the contact openings and it will deposit the Pd particles with very good adhesion onto the inside of the contact opening.

Next, a first liner 30 is provided by forming the first liner on exposed surfaces (including wall surfaces within the line and via opening) of the second dielectric material 24 as well as atop a surface of the Co-containing buffer layer 28. The resultant structure is shown, for example, in FIG. 2C. The first liner 30 comprises TaN, TiN, RuN, RuTa, RuTaN, WN or any other like metal nitride containing material. Multilayers of the metal nitride containing materials are also contemplated. The first liner 30 is formed utilizing a deposition process such as, for example, atomic layer deposition (ALD), chemical vapor deposition (CVD), plasma enhanced chemical vapor deposition (PECVD), physical vapor deposition (PVD), sputtering, chemical solution deposition, or plating.

Figure 2C:
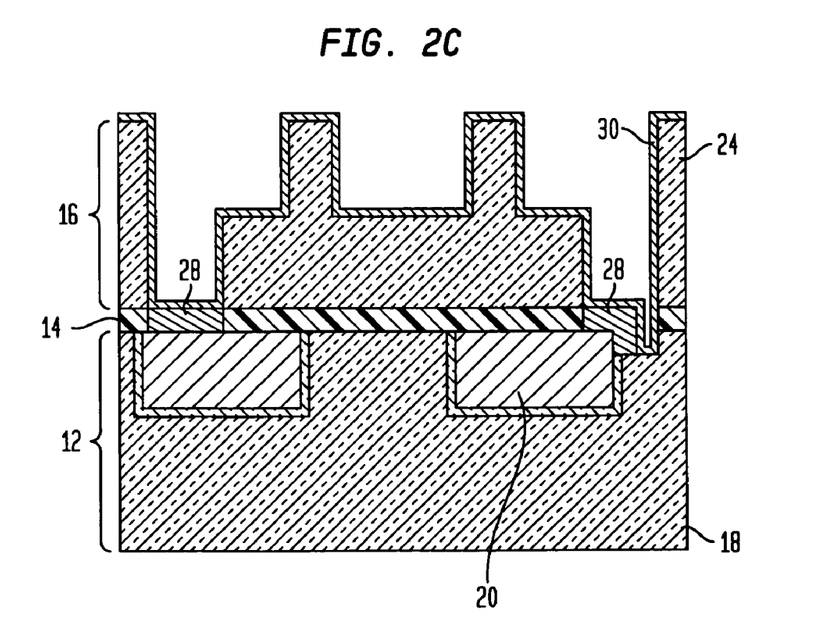

The thickness of the first liner 30 may vary depending on the number of material layers within the first liner, the technique used in forming the same as well as the material of the first liner itself. Typically, the first liner 30 has a thickness from about 1 to about 20 nm, with a thickness from about 3 to about 10 nm being even more typical.

A second liner 32 is then formed atop the first liner 30. It is noted that liners 30 and 32 form a diffusion barrier that prevents diffusion of a conductive material from a conductive region into the dielectric material. The resultant structure including the second liner 32 is shown, for example, in FIG. 2D.

Figure 2D:
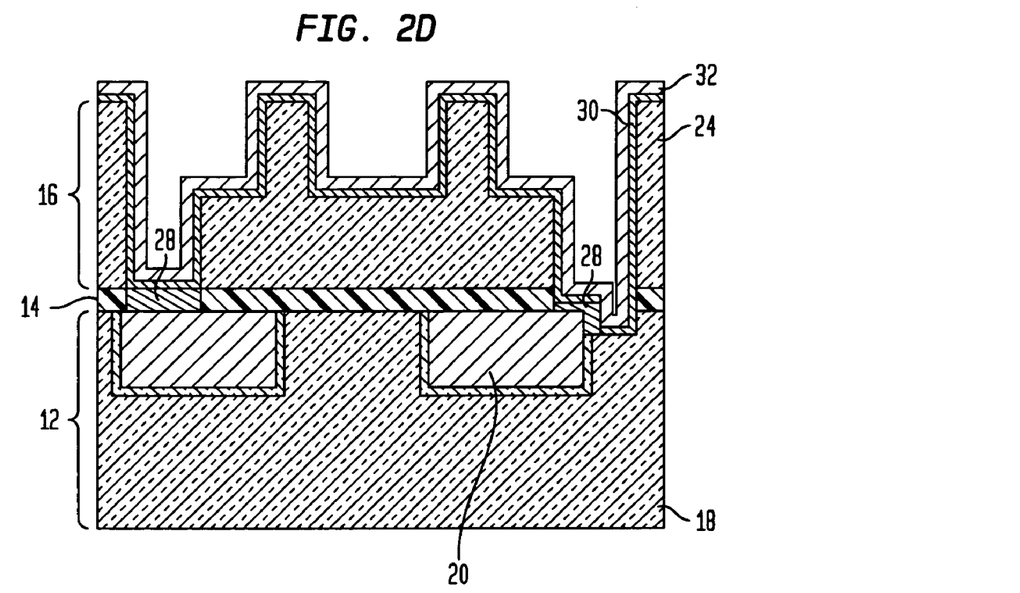

The second liner 32 comprises Ta, Ti, Ru, Ir, Pt, Rh or any other like metal material. Multilayers of these metal materials are also contemplated. The second liner 32 is formed utilizing a deposition process such as, for example, atomic layer deposition (ALD), chemical vapor deposition (CVD), plasma enhanced chemical vapor deposition (PECVD), physical vapor deposition (PVD), sputtering, chemical solution deposition, or plating.

The thickness of the second liner 32 may vary depending on the number of material layers within the second liner, the technique used in forming the same as well as the material of the second liner itself. Typically, the second liner 32 has a thickness from about 1 to about 20 nm, with a thickness from about 3 to about 10 nm being even more typical.

It is noted that in this embodiment of the present invention, the first and second liners 30 and 32, respectively, are both present continuously within the line opening and the via opening.

At this point of the present invention, an optional plating seed layer (not shown) can be formed within the openings atop the second liner 32. Although optional, it is preferred to include a plating seed layer within the structure to aid in growth of the conductive material. This is especially the case when a conductive metal or metal alloy is to be subsequently formed within the at least one opening. When present, the plating seed layer may comprise a conductive metal or metal alloy such as that used in forming the conductive material to be described in greater detail herein below. Typically, and when the conductive material comprises Cu, the plating seed layer comprises Cu, CuAl, CuIr, CuTa, CuRh, TaRu, or other alloys of Cu, i.e., Cu-containing alloys.

The plating seed layer is formed by a conventional deposition process including, for example, ALD, CVD, PECVD, PVD, chemical solution deposition and other like deposition processes. The thickness of the plating seed layer may vary and it is within ranges that are well known to those skilled in the art. Typically, the plating seed layer has a thickness from about 2 to about 80 nm.

Figure 2E:
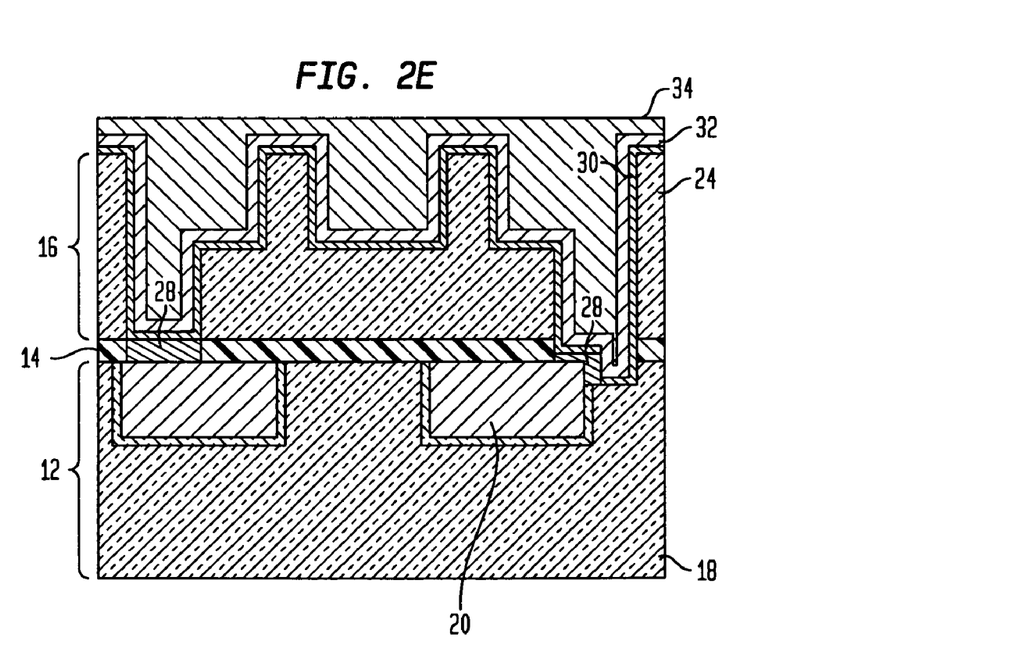
Figure 2F:
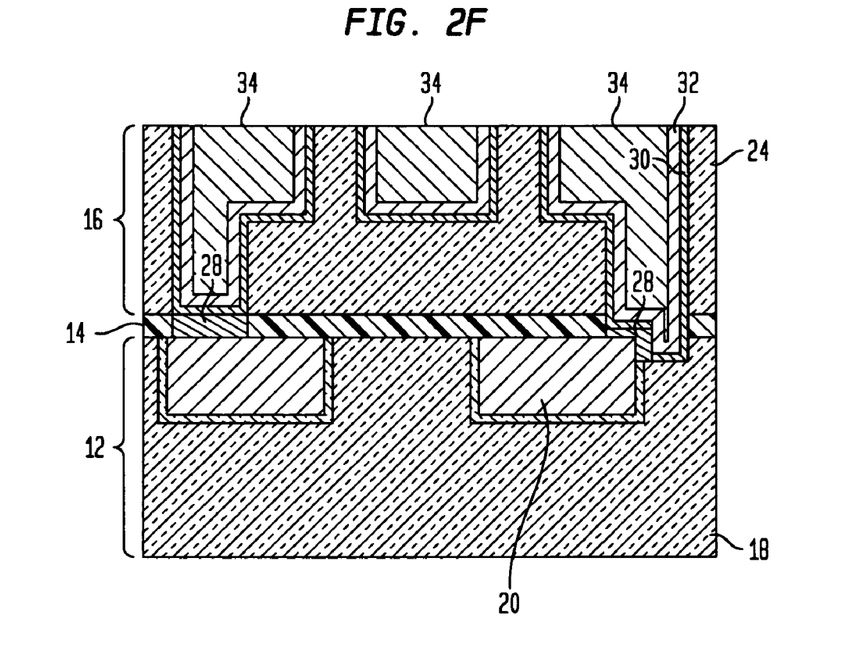

Next, an interconnect conductive material 34 is formed within the at least one opening. The interconnect conductive material 34 may comprise the same or different, preferably the same, conductive material as that of the conductive feature 20. Preferably, Cu, Al, W or alloys thereof are used, with Cu or AlCu being most preferred. The conductive material 34 is formed utilizing the same deposition processing as described above in forming the conductive feature 20 and following deposition of the conductive material 34, the structure is subjected to planarization. FIG. 2E shows the interconnect structure after conductive material 34 deposition, while FIG. 2F shows the interconnect structure after planarization. The planarization process, which includes grinding and/or chemical mechanical polishing (CMP) removes the first and second liners 30 and 23, respectively, the plating seed layer (if present) and conductive material 34 that is present above the upper horizontal surface of the upper interconnect level 16 providing the structure shown in FIG. 2F.

Figure 3:
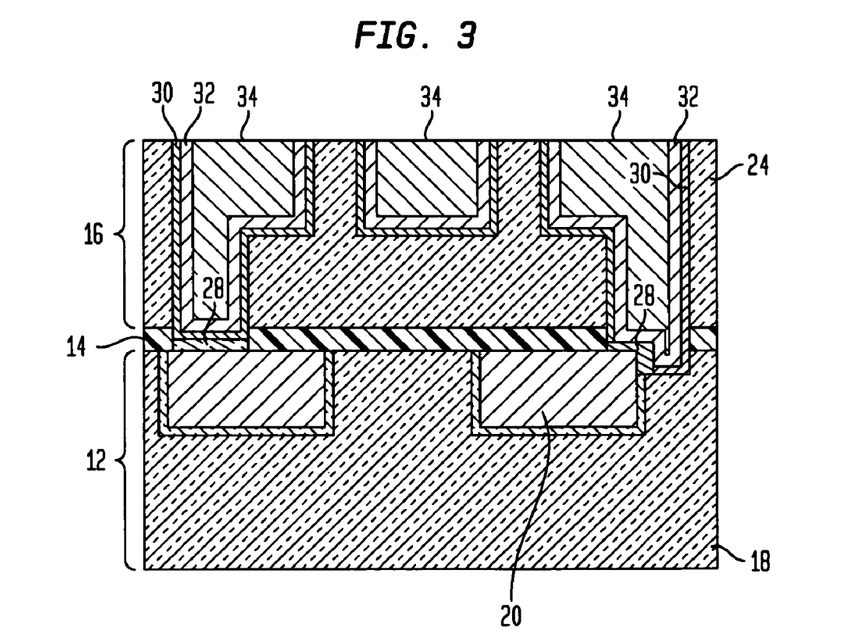
FIG. 3 is an pictorial representation (through a cross sectional view) showing the inventive interconnect structure formed utilizing a second embodiment of the present application.

Reference is now made to the structure shown in FIG. 3. Specifically, the structure shown in FIG. 3 represents another embodiment of the present application. In this other embodiment of the present invention, the first liner 30 is not present continuously within the bottom via portion. Specifically, the first liner 30 has been removed from the bottom of the via by a sputtering process which is performed after depositing the first liner 30 within the at least one opening. All other processing steps as described above in connection with FIGS. 2A-2F are performed in fabricating this alternative interconnect structure shown in FIG. 3.

It is again noted that the interconnect structures of the present application have increased reliability as well as increased strength of via to wire connection as compared with prior art interconnect structures. The increased reliability and strength is obtained without introducing a gouging feature into the via bottom. Since no gouging features are present in the inventive interconnect structures, the dielectric material of the inventive interconnect structures is not damaged (and hence not roughened) as is the case with prior art interconnect structures that utilizing an Ar sputtering process to introduce the gouging feature into the via bottom.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A semiconductor structure comprising:

A lower interconnect level comprising a first dielectric material having at least one conductive feature embedded therein, said at least one conductive feature is spaced apart from said first dielectric layer by a barrier layer;

an upper interconnect level comprising a second dielectric material having at least one opening that is in direct contact with said at least one conductive feature of the lower interconnect level, wherein said at least one opening comprises a via having at least one vertical sidewall that is located atop the at least one conductive feature within the first dielectric material, said via is misaligned relative to the surface of said at least one conductive feature;

a dielectric capping layer located, in part, between said upper and lower interconnect levels, said dielectric capping layer extends upon a portion of the at least one conductive feature of said lower interconnect level;

a Co-containing buffer layer disposed in said at least one opening on an exposed upper surface of said at least one conductive feature of the lower interconnect level and on exposed upper surface of the barrier layer which is recessed relative to the upper exposed surface of the at least one conductive feature, wherein a portion of said Co-containing buffer layer laterally abuts a sidewall of said dielectric capping layer;

first and second liners located within said at least one opening, wherein said first liner has a first portion on an entire top surface of said Co-containing buffer layer, and a second portion atop a recessed surface of the first dielectric material within said via that is misaligned, wherein the first liner is discontinuous between first and second portions; and a conductive material located on said second liner in said at least one opening.

2. The semiconductor structure of claim 1 wherein said first and second dielectric materials comprise the same or different dielectric material having a dielectric constant of about 4.0 or less.

3. The semiconductor structure of claim 1 wherein said at least one conductive feature and said conductive material of said upper interconnect level comprise the same or different conductive material selected from the group consisting of polySi, a conductive metal, an alloy comprising at least one conductive metal, a conductive metal silicide and combinations thereof.

4. The semiconductor structure of claim 3 wherein said at least one conductive feature and said conductive material of said upper interconnect level comprise Cu or a Cu-containing alloy.

5. The semiconductor structure of claim 1 wherein said Co-containing buffer layer comprises elemental Co alone, or elemental Co with at least one of P and B.

6. The semiconductor structure of claim 5 wherein said Co-containing buffer layer comprising elemental Co with at least one of P and B, further comprises W.

7. A semiconductor structure comprising:

A lower interconnect level comprising a first dielectric material having at least one conductive feature embedded therein, said at least one conductive feature is spaced apart from said first dielectric layer by a barrier layer;

an upper interconnect level comprising a second dielectric material having at least one opening that is in direct contact with said at least one conductive feature of the lower interconnect level, wherein said at least one opening comprises a via having at least one vertical sidewall that is located atop the at least one conductive feature within the first dielectric material, said via is misaligned relative to the surface of said at least one conductive feature;

a dielectric capping layer located, in part, between said upper and lower interconnect levels, said dielectric capping layer extends upon a portion of the at least one conductive feature of said lower interconnect level;

a Co-containing buffer layer disposed in said at least one opening on an exposed upper surface of said at least one conductive feature of the lower interconnect level and on exposed upper surface of the barrier layer which is recessed relative to the upper exposed surface of the at least one conductive feature, wherein a portion of said Co-containing buffer layer laterally abuts a sidewall of said dielectric capping layer;

first and second liners located within said at least one opening, and said second liner located continuously within the at least one opening, wherein said first liner has a first portion on an entire top surface of said Co-containing buffer layer, and a second portion atop a recessed surface of the first dielectric material within said via that is misaligned, wherein the first liner is discontinuous between first and second portions; and a conductive material located on said second liner in said at least one opening.

8. The semiconductor structure of claim 7 wherein said first and second dielectric materials comprise the same or different dielectric material having a dielectric constant of about 4.0 or less.

9. The semiconductor structure of claim 7 wherein said at least one conductive feature and said conductive material of said upper interconnect level comprise the same or different conductive material selected from the group consisting of polySi, a conductive metal, an alloy comprising at least one conductive metal, a conductive metal silicide and combinations thereof 10. The semiconductor structure of claim 9 wherein said at least one conductive feature and said conductive material of said upper interconnect level comprise Cu or a Cu-containing alloy.

11. The semiconductor structure of claim 7 wherein said Co-containing buffer layer comprises elemental Co alone, or elemental Co with at least one of P and B.

12. The semiconductor structure of claim 11 wherein said Co-containing buffer layer comprising elemental Co with at least one of P and B, further comprises W.

* * * * *